US012688950B2

(12) United States Patent
Turner et al.

(10) Patent No.: US 12,688,950 B2
(45) Date of Patent: Jul. 21, 2026

(54) HIGH-TEMPERATURE SUPERCONDUCTOR (HTS)-BASED FLEXIBLE CABLING SYSTEMS FOR INTERCONNECTING COMPONENTS IN TWO DIFFERENT CRYOGENIC TEMPERATURE ZONES

(71) Applicant: Microsoft Technology Licensing, LLC, Redmond, WA (US)

(72) Inventors: Matthew David Turner, Duvall, WA (US); Flavio Griggio, Seattle, WA (US); Craig Steven Ranta, Olympia, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 264 days.

(21) Appl. No.: 18/656,144

(22) Filed: May 6, 2024

(65) Prior Publication Data

US 2025/0342986 A1 Nov. 6, 2025

(51) Int. Cl.
*H01B 12/16* (2006.01)
*H01R 4/68* (2006.01)
(Continued)

(52) U.S. Cl.
CPC .............. *H01B 12/16* (2013.01); *H01R 4/68* (2013.01); *H01B 12/02* (2013.01); *H02G 15/34* (2013.01); *H10N 60/20* (2023.02); *Y02E 40/60* (2013.01)

(58) Field of Classification Search
CPC .... H01B 12/02; H01B 12/00–16; H01R 4/68; H02G 15/34; H03K 19/195; Y02E 40/60; H10N 60/20
See application file for complete search history.

(56) References Cited

U.S. PATENT DOCUMENTS 10,141,493 B2 11/2018 Tuckerman
10,453,592 B1 * 10/2019 Smith .................... H01B 12/16
(Continued)

FOREIGN PATENT DOCUMENTS

CN 117378297 A 1/2024
JP 5492600 B2 5/2014

OTHER PUBLICATIONS

Jain, et al., "Optimization of REBa2Cu3O7-x on Flexible, Dielectric Substrates for High-Frequency Applications," IEEE Transactions on Applied Superconductivity, vol. 33, Issue No. 5, 2023, pp. 1-5.
(Continued)

*Primary Examiner* — Steven T Sawyer
(74) *Attorney, Agent, or Firm* — Ranjeev Singh; Singh Law, PLLC

(57) ABSTRACT

High temperature superconductor (HTS)-based flexible cabling systems configured to provide signaling between two different cryogenic temperature zones are described. An HTS-based flexible cabling system includes a first HTS-based flexible cable arranged next to a second HTS-based flexible cable with a spacer configured to maintain a fixed spacing between the first HTS-based flexible cable and the second HTS-based flexible cable. Each of the first HTS-based flexible cable and the second HTS-based flexible cable includes traces to define individual strips having a first strip width in a first region along a length of each of the first HTS-based flexible cable and the second HTS-based flexible cable and a second strip width, different from the first strip width, in a second region where the spacer is overlapping with a respective HTS-based flexible cable. The HTS-based flexible cabling system further includes a heat-transfer structure coupled to the spacer and a temperature-dependent thermal conductor.

20 Claims, 9 Drawing Sheets

(51) Int. Cl.
| | |
|---|---|
| *H01B 12/02* | (2006.01) |
| *H02G 15/34* | (2006.01) |
| *H10N 60/20* | (2023.01) |

(56) References Cited

U.S. PATENT DOCUMENTS

| | | | | |
|---|---|---|---|---|
| 2013/0130913 | A1* | 5/2013 | Citver | H10N 60/80 |
| | | | | 505/150 |
| 2018/0294401 | A1* | 10/2018 | Tuckerman | H10N 60/80 |
| 2019/0181326 | A1* | 6/2019 | Deutscher | H10N 60/0408 |
| 2022/0375869 | A1* | 11/2022 | Yee | H10N 60/80 |
| 2023/0361549 | A1* | 11/2023 | Hartwig | H01B 12/02 |
| 2025/0063650 | A1* | 2/2025 | Turner | H05K 1/0203 |

OTHER PUBLICATIONS

International Search Report and Written Opinion received for PCT Application No. PCT/US2025/018622, mailed on May 26, 2025, 15 pages.

Piekarz, et al., "Design, Construction, and Test Arrangement of a Fast-Cycling HTS Accelerator Magnet", IEEE Transactions on Applied Superconductivity, vol. 24, No. 3, Jun. 2014, 4 pages.

\* cited by examiner

232

212

230

210

234

214

200

322

312

310

324

300

1

HIGH-TEMPERATURE SUPERCONDUCTOR (HTS)-BASED FLEXIBLE CABLING SYSTEMS FOR INTERCONNECTING COMPONENTS IN TWO DIFFERENT CRYOGENIC TEMPERATURE ZONES

BACKGROUND

Quantum computing systems include multiple cryogenic temperature zones, including cryogenic temperature zones below 30 milli-kelvin (mK) for interfacing with the quantum bits (qubits) and cryogenic temperature zones above 2 K for interconnecting components among the relatively warmer cryogenic temperature zones. Current solutions for wiring in relatively warmer cryogenic temperature zones (e.g., cryogenic temperature zones above 2 K) include the use of conventional conductors. Such conventional conductors have a higher thermal conductivity resulting in transfer of a higher amount of heat from the warmer cryogenic temperature zones to the cooler cryogenic temperature zones. An alternative solution is to use bulk high-temperature superconductors, which are fragile and will necessarily require a larger cross section.

Accordingly, there is a need for improved cabling systems for interconnecting components operating in certain cryogenic temperature zones.

SUMMARY

In one example, the present disclosure relates to a high temperature superconductor (HTS)-based flexible cabling system configured to interconnect a first set of components in a first cryogenic temperature zone with a second set of components in a second cryogenic temperature zone, where the first cryogenic temperature zone has a temperature between 2 kelvin to 10 kelvin and the second cryogenic temperature zone has a temperature between 30 kelvin to 92 kelvin. The HTS-based flexible cabling system may include a first HTS-based flexible cable arranged next to a second HTS-based flexible cable with at least one intervening spacer configured to maintain a fixed spacing between the first HTS-based flexible cable and the second HTS-based flexible cable.

Each of the first HTS-based flexible cable and the second HTS-based flexible cable may include traces to define individual strips having a first strip width in a first region along a length of each of the first HTS-based flexible cable and the second HTS-based flexible cable and a second strip width, different from the first strip width, in a second region where the at least one intervening spacer is overlapping with a respective HTS-based flexible cable. The HTS-based flexible cabling system may further include a heat-transfer structure coupled to the at least one intervening spacer and a temperature-dependent thermal conductor.

In another example, the present disclosure relates to a high temperature superconductor (HTS)-based flexible cabling system configured to interconnect a first set of components in a first cryogenic temperature zone with a second set of components in a second cryogenic temperature zone, where the first cryogenic temperature zone has a temperature between 2 kelvin to 10 kelvin and the second cryogenic temperature zone has a temperature between 30 kelvin to 92 kelvin. The HTS-based flexible cabling system may include a first HTS-based flexible cable arranged next to a second HTS-based flexible cable with at least one intervening spacer configured to maintain a fixed spacing between the first HTS-based flexible cable and the second HTS-based flexible cable.

Each of the first HTS-based flexible cable and the second HTS-based flexible cable includes traces to define individual strips having a first strip width in a first region along a length of each of the first HTS-based flexible cable and the second HTS-based flexible cable and a second strip width, different from the first strip width, in a second region where the at least one intervening spacer is overlapping with a respective HTS-based flexible cable, and where each of the first HTS-based flexible cable and the second HTS-based flexible cable includes widened pads at respective ends. The HTS-based flexible cabling system may further include a heat-transfer structure coupled to the at least one intervening spacer and a temperature-dependent thermal conductor.

In yet another example, the present disclosure relates to a high temperature superconductor (HTS)-based flexible cabling system configured to interconnect a first set of components in a first cryogenic temperature zone with a second set of components in a second cryogenic temperature zone, where the first cryogenic temperature zone has a temperature between 2 kelvin to 10 kelvin and the second cryogenic temperature zone has a temperature between 30 kelvin to 92 kelvin. The HTS-based flexible cabling system may include a first HTS-based flexible cable arranged next to a second HTS-based flexible cable with at least one intervening spacer configured to maintain a fixed spacing between the first HTS-based flexible cable and the second HTS-based flexible cable. Each of the first HTS-based flexible cable and the second HTS-based flexible cable includes traces to define individual strips having a first strip width in a first region along a length of each of the first HTS-based flexible cable and the second HTS-based flexible cable and a second strip width, different from the first strip width, in a second region where the at least one intervening spacer is overlapping with a respective HTS-based flexible cable, and where each of the first HTS-based flexible cable and the second HTS-based flexible cable includes a widened pads at each respective ends.

The HTS-based flexible cabling system may further include a connector block having connection points for coupling the widened pads at each of the respective ends to the first set of components, the second set of components, or another electrical structure. The HTS-based flexible cabling system may further include a heat-transfer structure coupled to the at least one intervening spacer and a temperature-dependent thermal conductor.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to high-temperature superconductor (HTS)-based flexible cabling systems for interconnecting components in two different cryogenic temperature zones. Quantum computing systems include multiple cryogenic temperature zones, including cryogenic temperature zones below 30 milli-kelvin (mK) for interfacing with the quantum bits (qubits) and cryogenic temperature zones above 2 K for interconnecting components among the relatively warmer cryogenic temperature zones. Current solutions for wiring in relatively warmer cryogenic temperature zones (e.g., cryogenic temperature zones above 2 K) include the use of conventional conductors. Such conventional conductors have a higher thermal conductivity resulting in transfer of a higher amount of heat from the warmer cryogenic temperature zones to the cooler cryogenic temperature zones. An alternative solution is to use bulk high-temperature superconductors, which are fragile and will necessarily require a larger cross section. Neither of these solutions address unique problems posed by systems for interconnecting components operating in such cryogenic temperatures zones.

As an example, when quantum computing devices (e.g., qubit devices) are connected to other types of logic based systems, such as systems based on CMOS devices, they need to be interconnected via high-speed communication links. In one example, such communication links may need to operate at 10-100 Gigabits per second (Gbits/s). In one example, components operating in a cryogenic environment may require a vacuum to operate properly. The vacuum may relate to a pressure in a range of $10^{-3}$ Torr to $10^{-10}$ Torr. The HTS-based flexible cabling systems along with the other components described herein may be used to provide such high-speed communication links for interconnecting components operating in certain cryogenic temperature zones.

Figure 1:
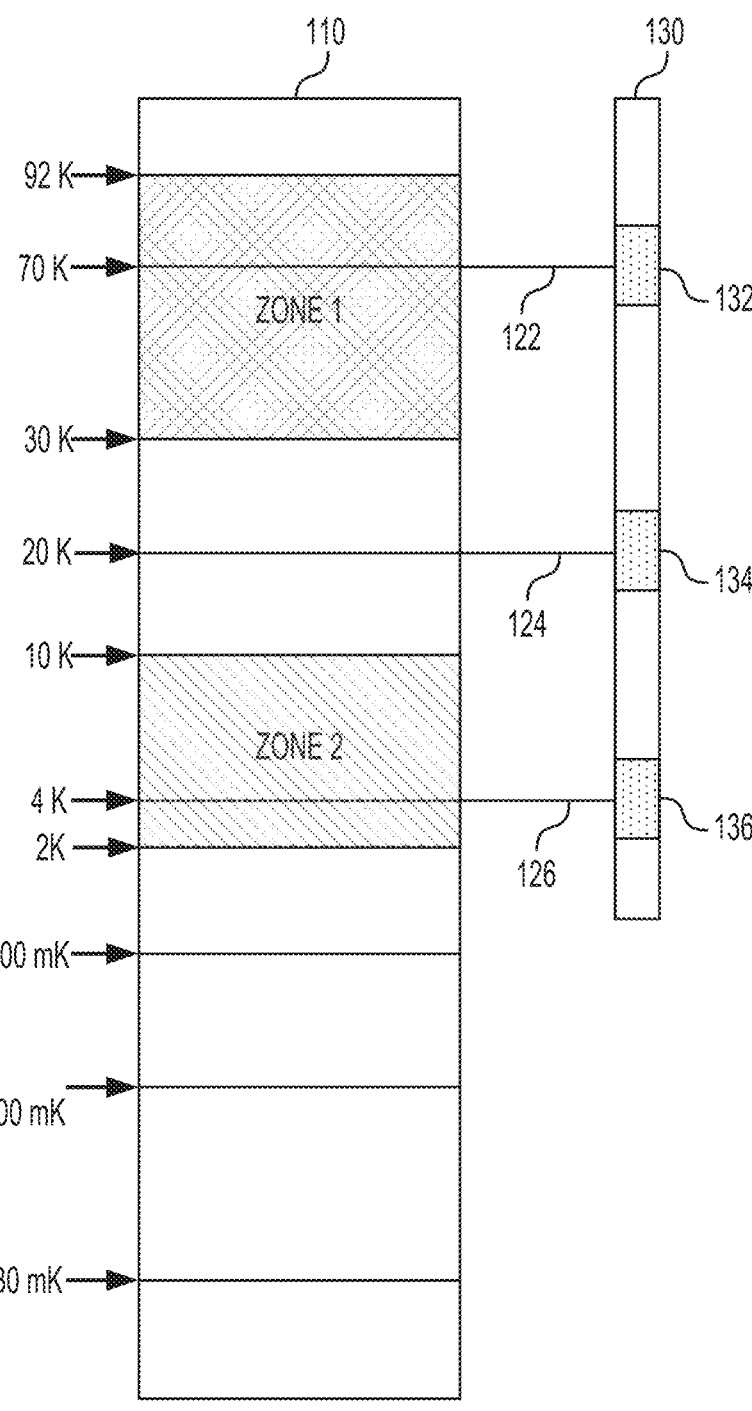
FIG. 1 shows a system environment for implementing high-temperature superconductor (HTS)-based flexible cabling systems with lowered thermal conductivity for signaling between two cryogenic temperature zones in accordance with one example.

FIG. 1 shows a system environment 100 for implementing high-temperature superconductor (HTS)-based flexible cabling systems with lowered thermal conductivity for signaling between two cryogenic temperature zones in accordance with one example. System environment 100 incudes a thermal hierarchy 110 on the left and an example HTS-based interconnect 130 on the right. Thermal hierarchy 110 shows a range of temperatures (e.g., below 30 mK to 92 K) associated with system environment 100. System environment 100 may include one or more housing assemblies to enclose various sections via cryostat walls or other such structures. Various housing assemblies are further configured to maintain a vacuum within respective housing assemblies. The vacuum may correspond to a pressure in a range between $10^{-3}$ Torr to $10^{-10}$ Torr. System environment 100 further shows two different cryogenic temperature zones (e.g., ZONE 1 and ZONE 2), each of which could correspond to a zone in which a certain temperature range is maintained and vacuum with a pressure in a range between $10^{-3}$ Torr to $10^{-10}$ Torr is maintained.

With continued reference to FIG. 1, in this example, HTS-based interconnect 130 may be used to interconnect the components located in one cryogenic temperature zone (e.g., ZONE 1 in FIG. 1) with the components located in another cryogenic temperature zone (e.g., ZONE 2 in FIG. 1). In this example, ZONE 1 corresponds to a temperature between 30 K to 92 K and ZONE 2 corresponds to a temperature between 2 K to 10 K. In this example, HTS-based interconnect 130 is shown with sections 132, 134 and 136, which are coupled to cold plates or cold pipes (not shown) to thermalize the HTS-based interconnect 130 along its length. Thermal clamps, or other such structures (not shown), may be used to couple via couplings 122, 124, and 126, respective sections 132, 134 and 136 of the HTS-based interconnect 130. As explained further below, the use of modular components, such as spacers, may allow for attachment points along the length of HTS-based interconnect 130. Quantum computing is one of the use cases for system environment 100 since quantum computing requires getting the signals down from room temperature to the colder zones in the dilution fridge (e.g., qubits being maintained at 20 mK or below). Although FIG. 1 shows a system environment 100 with various cryogenic temperature zones as part of a thermal hierarchy, system environment 100 may correspond to other cryogenic temperature zones as part of a different thermal hierarchy. In addition, although FIG. 1 shows certain sections of the HTS-based interconnect 130 being thermalized, fewer or additional sections located along the length of the HTS-based interconnect 130 may also be thermalized.

Examples described in this disclosure further relate to HTS-based interconnects for interconnecting modules operating in two different cryogenic temperature zones. For a given DC electrical resistance, the heat leakage is set mainly by the Wiedemann-Franz law, which establishes a proportionality between electrical conductivity and thermal conductivity. Signal attenuation for high-frequency signals, however, is determined by the high-frequency electrical loss, which is typically much larger than the DC electrical loss in conventional cables. In order to achieve the best possible heat leakage, limited only by the Wiedemann-Franz law, one may need a cable where the DC electrical loss is comparable to the RF loss. This may require the conductors in the cable to be thin relative to the skin depth at the frequencies of interest (typically sub-micron dimensions at GHz frequencies).

Advantageously, compared with conventional copper coaxial cables and stainless steel coaxial cables, the HTS-based interconnects may support high signal density and high-speed electrical signals over long distances with minimal loss. In addition, such interconnects may allow for high speed continuous interconnection with low or no transduction and minimal thermal loading of the cryogenic environment. Moreover, the HTS-based interconnects may not require the use of active electronics to achieve such advantages. Such cryogenic wiring solutions will also allow for scaling up of the quantum computing systems. This is because the modular flexible cables included as part of the HTS-based interconnects will allow for a higher density of wiring with less heat leakage, reducing both the volume and the power needed for cooling.

Figure 2:
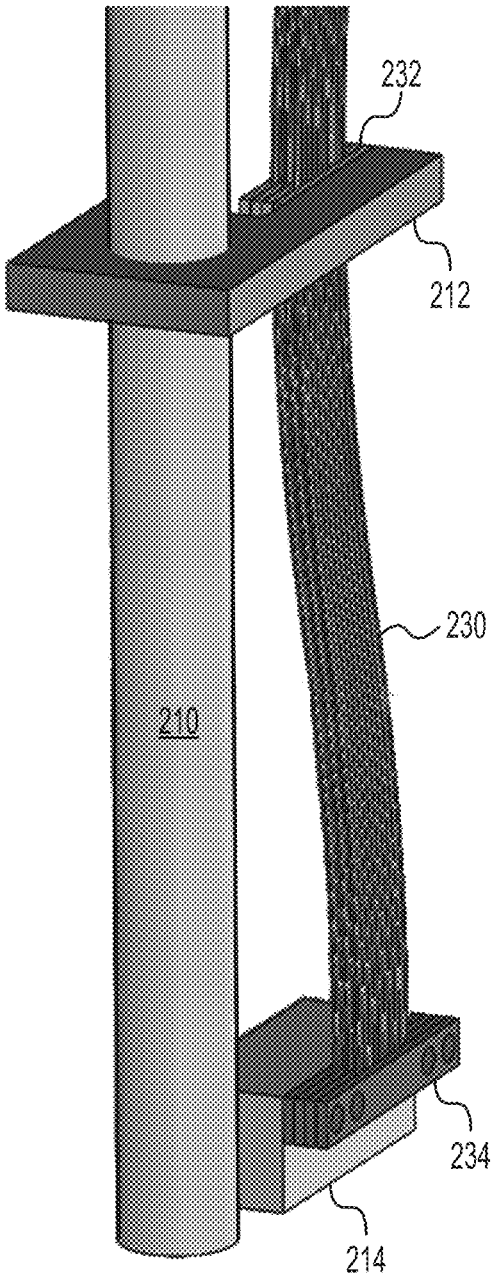
FIG. 2 shows an HTS-based flexible cabling system with lowered thermal conductivity for signaling between two cryogenic temperature zones in accordance with one example.

FIG. 2 shows an (HTS)-based flexible cabling system 200 with lowered thermal conductivity for signaling between two cryogenic temperature zones in accordance with one example. As an example, the HTS-based flexible cabling system 200 may be deployed as part of system environment 100 of FIG. 1. The HTS-based flexible cabling system 200 includes an HTS-based interconnect 230 (for use as HTS-based interconnect 130 of FIG. 1). The HTS-based interconnect 230 includes multiple flexible cables that are combined into a single assembly. Each of the flexible cables is designed for low thermal conductivity but must be cooled down below the superconducting transition point for high-temperature superconductors. Spacer assemblies 232 and 234 can be used to maintain a fixed and consistent spacing between adjacent flexible cables.

With continued reference to FIG. 2, heat pipe 210 may be used to thermalize sections of HTS-based interconnect 230 along its length such that the temperature along the entire length of the HTS-based interconnect 230 is below the critical temperature for superconducting. In one example, heat pipe 210 may be configured as a hollow thin-walled tube containing a fluid with a condensation point above an expected operating temperature and below the superconducting transition temperature of the high-temperature superconductor. Being thin-walled, heat pipe 210 has low thermal conductivity in the mechanical structure and the heat pipe 210 is filled with a suitable fluid. Any fluid that is a good thermal conductor in the gaseous phase could be used. As an example, heat pipe 210 could be filled with helium, which is a good thermal conductor in the gaseous phase but is a poor thermal conductor after the helium condenses. In this manner, heat pipe 210 provides a good thermal path between when helium is above the condensation temperature of helium, but once helium cools to below its condensation temperature, the helium condenses and is no longer conducting heat along the length of heat pipe 210. In this manner, heat pipe 210 acts a temperature dependent thermal conductor-providing a higher thermal conductivity before cooling down to the condensation temperature of the fluid (e.g., liquid helium) inside the heat pipe 210 and providing a lower thermal conductivity after cooling down to the condensation temperature of the fluid.

Still referring to FIG. 2, one or more attachment points along the length of the HTS-based interconnect 230 are selected for coupling with heat pipe 210. In this example, the attachment points are spacer assemblies 232 and 234, respectively. Spacer assembly 232 is coupled via a thermal clamp 212 to heat pipe 210. Spacer assembly 234 is coupled via another thermal clamp 214 (or a similar structure) to heat pipe 210. Although FIG. 2 shows certain spacers of the HTS-based interconnect 230 being used as attachment points for heat pipe 210, other attachments points located along the length of the HTS-based interconnect 230 may also serve as attachment points. In addition, a flexible attachment, e.g., wire braid, may also be used to attach the spacer assemblies to heat pipe 210.

Figure 3:
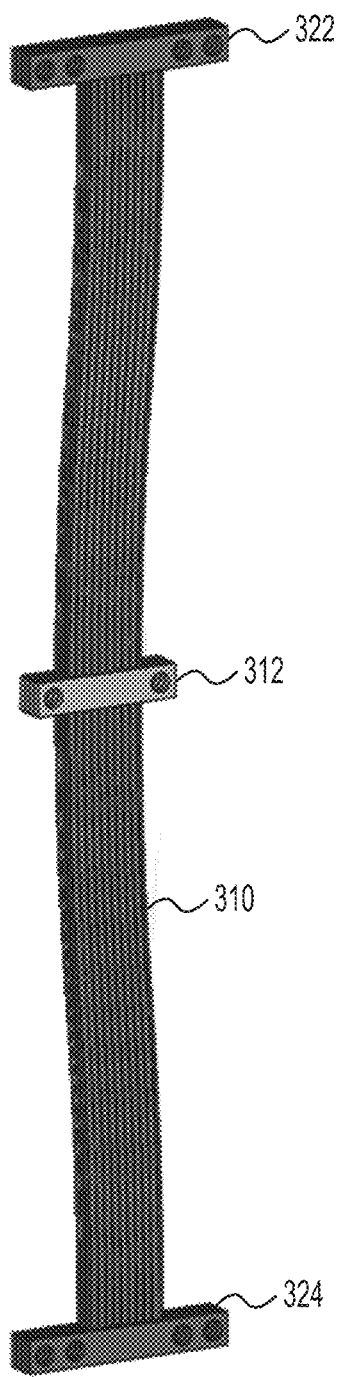
FIG. 3 shows an HTS-based interconnect with a spacer assembly and two connectors in accordance with one example.

FIG. 3 shows an HTS-based interconnect 300 with a spacer assembly and two connectors in accordance with one example. As noted earlier, the HTS-based interconnect 300 (e.g., similar to HTS-based interconnect 230) includes multiple flexible cables 310 that are combined into a single assembly. Each of the flexible cables 310 is designed for low thermal conductivity but must be cooled down below the superconducting transition point for high-temperature superconductors. Spacer assembly 312 includes several spacers that can be used to maintain a fixed and consistent spacing between adjacent flexible cables. At each end of the HTS-based interconnect 300 a connector block (e.g., a connector block 322 on one end and a connector block 324 at the other end) is shown. Each of the connector blocks 322 and 324 provide the ability to make electrical connection to other cables or electronics. In addition, such connector blocks 322 and 324 also provide mechanical connection points between the HTS-based interconnect 300 and a containing structure (e.g., a cryostat or other type of housing assemblies).

In one example, HTS-based interconnect 300 may include a combination of materials, including a substrate layer. HTS-based interconnect 300 may further include a high-temperature superconductor (HTS) layer formed over the substrate layer. In one example, the substrate layer may be formed using a flexible ceramic material. Moreover, yttria-stabilized zirconia (YSZ) may also be used as the substrate layer. Alternatively, a polyimide film, such as Kapton, may also be used. The substrate layer may range between 20 microns to 100 microns. The substrate layer may include multiple layers, as well. As an example, YSZ may be coated on a glass substrate or a ceramic substrate.

With continued reference to FIG. 3, the high-temperature superconductor layer of HTS-based interconnect 300 may be formed using certain copper oxides or rare-earth (Re) metal compounds. Example materials include yttrium barium copper oxides (YBCOs), bismuth strontium calcium copper oxides (BSCCOs), or rare-earth metal oxides (REBCOs). In one example, the high-temperature superconductor layer may have a thickness in a range between 1 micron to 5 microns. Although FIG. 3 shows HTS-based interconnect 300 as including a certain number of components arranged in a certain manner, HTS-based interconnect 300 may include additional or fewer components, arranged differently.

Figure 4:
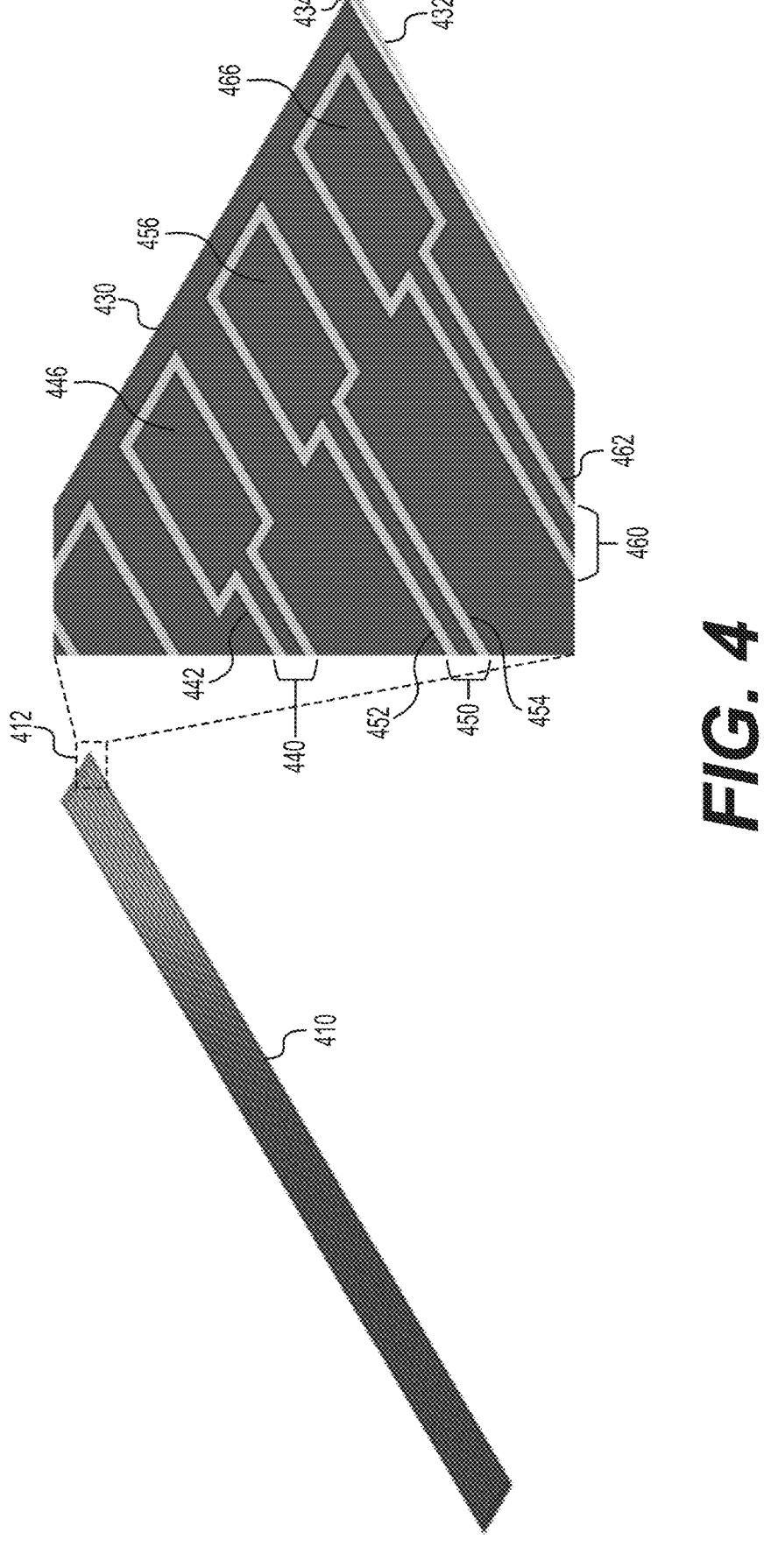
FIG. 4 shows an example flexible cable for use with the HTS-based interconnect of FIG. 3.

FIG. 4 shows an example flexible cable 410 for use with the HTS-based interconnect 300 of FIG. 3. Flexible cable 410 can comprise one of the multiple flexible cables that are separated by the spacers as shown in FIG. 3. Additional details of flexible cable 410 are shown via an expanded view corresponding to portion 412 of flexible cable 410. The top layer 430 of flexible cable 410 is formed by depositing (or otherwise forming) an HTS layer. Physical-vapor deposition or other such techniques can be used to deposit the high-temperature superconductor materials described earlier. Flexible cable 410 includes additional layers, such as an intermediate layer 434 and a substrate layer 432 (e.g., a flexible ceramic substrate or other such substrates described earlier). Intermediate layer 434 may be a buffer layer formed using magnesium oxide (MgO) or lanthanum niobium oxide $(LaNbO_3)$. Strips 440, 450, and 460 can be formed by selectively removing the HTS layer by laser-etching (or by using a similar technique) traces to define individual strips along the length of flexible cable 410. Thus, in one example, laser-etched moats can be formed to define each trace. As an example, FIG. 4 shows traces 442, 452, 454, and 462, which are formed as a result of selective removal of the HTS-layer. Traces 452 and 454 define the individual strip 450. The width of each strip is selected to ensure proper propagation of high-frequency RF signals along the length of each strip. To enable better electrical connections at the end of the flexible cable 410, widened pads 446, 456, and 466 can be formed by increasing the strip width. In addition, although not shown in FIG. 4, widened pads 446, 456, and 466 would be plated with a metal suitable for interconnecting the pads to other conductive elements, such as pins or pads. In one example, widened pads 446, 456, and 466 could be plated with silver (Ag). Although FIG. 4 shows flexible cable 410 with certain configuration of the strips and traces, flexible cable 410 can be formed with a different configuration of the strips and traces.

Figure 5:
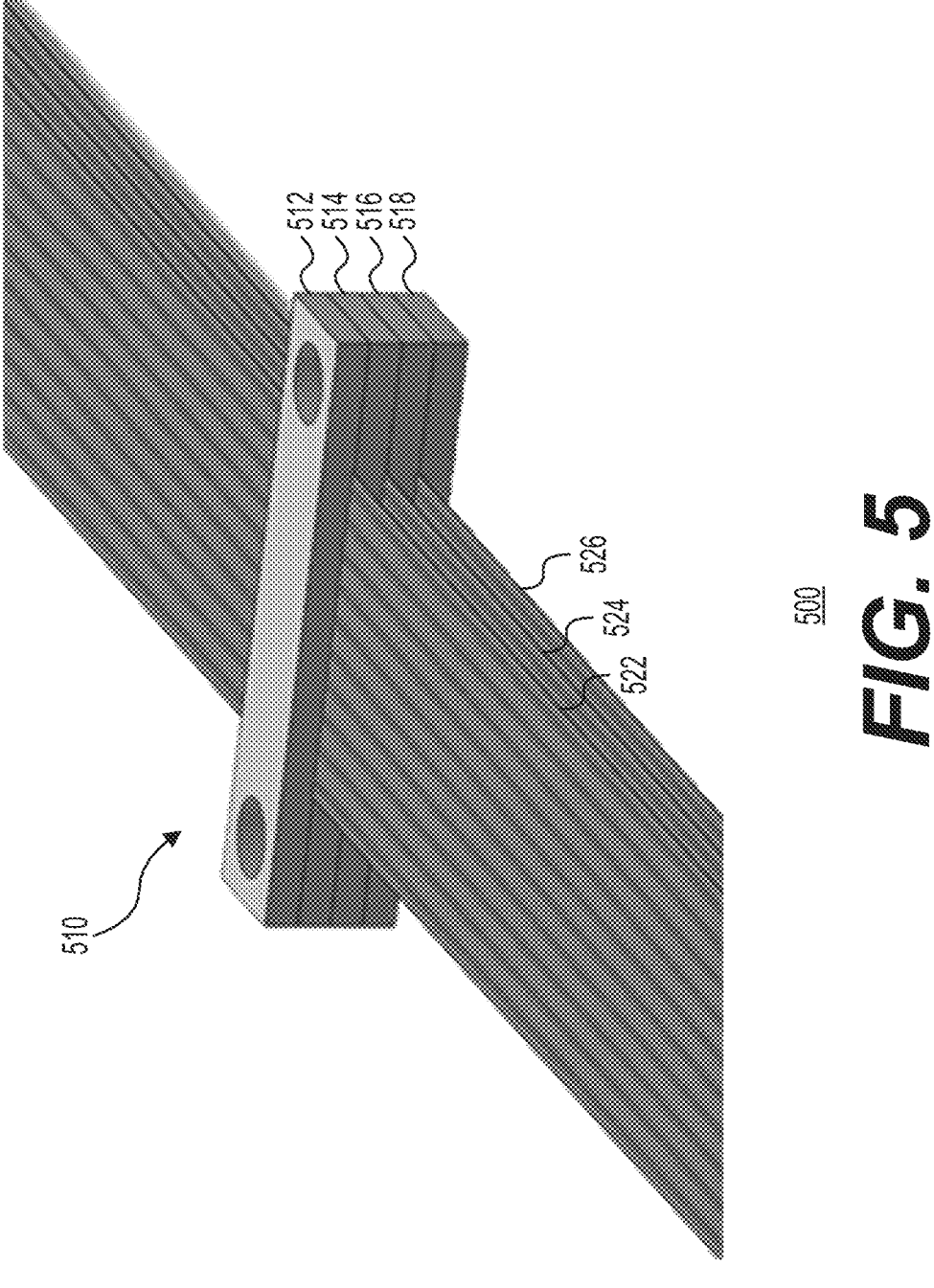
FIG. 5 shows a diagram of an HTS-based flexible cabling system with a lowered thermal load for use with cryogenic environments in accordance with another example.

FIG. 5 shows an example spacer assembly 510 for use with the HTS-based interconnect 300 of FIG. 3. Spacer assembly 510 is designed to combine multiple flexible cables (e.g., cables like flexible cable 410 of FIG. 4) into a single assembly with a fixed spacing and a fixed amount of dielectric between each of the flexible cables. In this example, spacer assembly 510 includes several spacers 512, 514, 516, and 518, which are arranged to combine flexible cables 522, 524, and 526 into a single HTS-based interconnect. Each of the spacers may be formed using a nonconductive material (e.g., sapphire) with high thermal conductivity at cryogenic temperatures.

Figure 6:
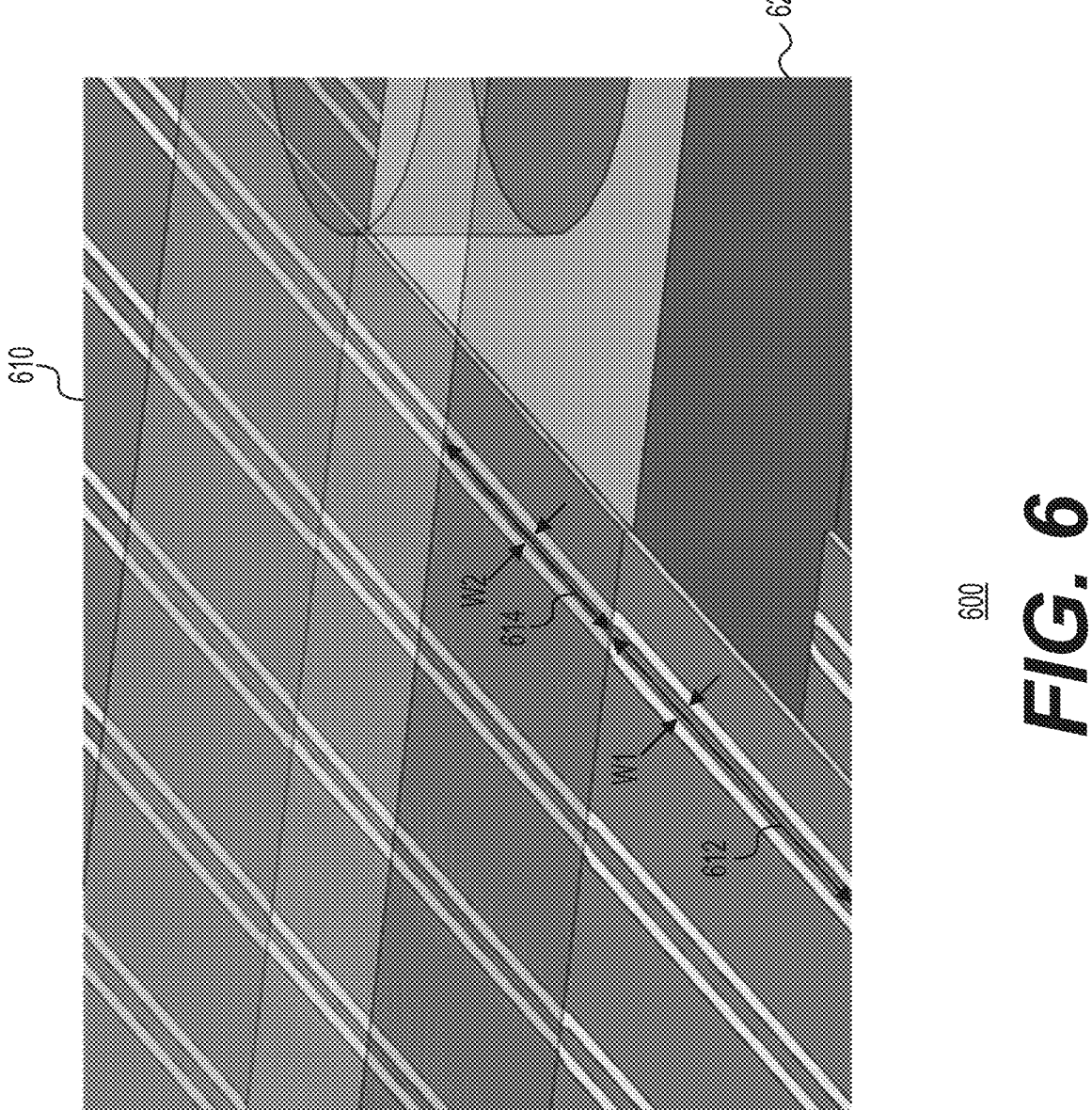
FIG. 6 is an expanded view of a portion of the flexible cable shown in FIG. 5.

FIG. 6 shows an expanded view 600 of a portion of a flexible cable (e.g., flexible cable 510 of FIG. 5) along with a portion of a spacer 620 (e.g., similar to spacer 512 of FIG. 5). The strip width of the strips, which are formed as part of the flexible cables, can be adjusted to compensate for the changes in the dielectric constant between the regions of the flexible cable that overlap with a spacer versus the regions of the flexible cable that do not overlap with a spacer. The strip width and the width of each of the traces (e.g., formed using laser-etching) is designed to ensure proper waveguide performance to allow for the propagation of high-frequency RF signals along each of the flexible cables. During the design phase of such flexible cables, the strip width is adjusted so that the impedance is matched along the length of the trace regardless of whether the flexible cable is surrounded by vacuum or when it is in direct contact with the spacer. The strip width is modified to account for the difference in the dielectric constant of the spacer material versus the dielectric constant for the vacuum. The modification is necessary to ensure that when the electric field associated with the signals propagating along the length of the flexible cable interact with the medium (e.g., vacuum or the spacer material), the differences in the strength of the interaction do not materially impact the signals. This is because any material changes in the strength of the interaction can change the impedance experienced by the signals propagating along a specific section of the flexible cable. Such undesirable impedance changes can cause signal reflections, resulting in the distortion of the high-frequency signals being communicated by the cables. As an example, as shown in FIG. 6, strip width W1 corresponds to section 612 of the flexible cable 610 and strip width W2 corresponds to section 614 of the flexible cable 610. Strip width W2 is smaller than the strip width W1 to compensate for the differences in the dielectric constant. Although FIG. 6 shows flexible cable 610 as including a certain arrangement of strips and strip widths, other arrangements may also be used. As an example, not only the strip width could be modified along the length of each strip, but also the trace width of each individual trace could be modified for similar reasons as provided above with respect to the strip width modification. Thus, as an example, trace width could be modified to change the impedance experienced by the signals propagating along a specific section of the flexible cable.

Figure 7A:
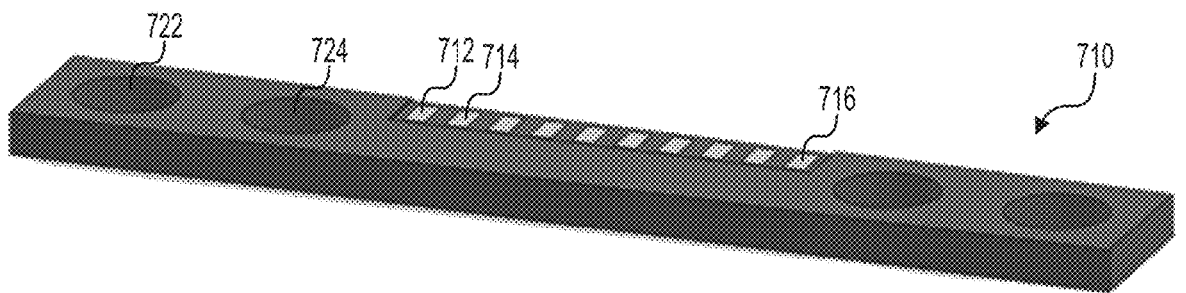
FIG. 7A shows a diagram of an example connector for use with the flexible cables for the HTS-based interconnect.

FIG. 7A shows a diagram of an example connector block 710 for use with the flexible cables for the HTS-based interconnect (e.g., HTS). In this example, connector block 710 includes flat pads 712, 714, and 716. Flat pads 712, 714, and 716 can be connected to flexible cables using anisotropic conductive films. Such an anisotropic conductive film can have adhesive material on each side of the film and can have thin wires that are nearly perpendicular to the surface of the film. Upon application of a certain amount of pressure to the film, the thin wires in the anisotropic film can form an electrical connection with the flat pads (e.g., flat pads 712, 714, and 716). Next, the flexible cable can be applied to the other side of the anisotropic conductive file to stick the high-temp superconductor flexible cable to the other side of film. The thin wires that are in the film provide conductive paths between the pads (e.g., widened pads 446, 456, and 466 shown in FIG. 4) on the cable and the flat pads on the connector block 710 (e.g., flat pads 712, 714, and 716). Flat pads 712, 714, and 716 can also be used with compliant (e.g., indium) or meltable metal (e.g., solder) connections. In addition, connector block 710 can include other structures, such as holes 722 and 724.

Figure 7B:
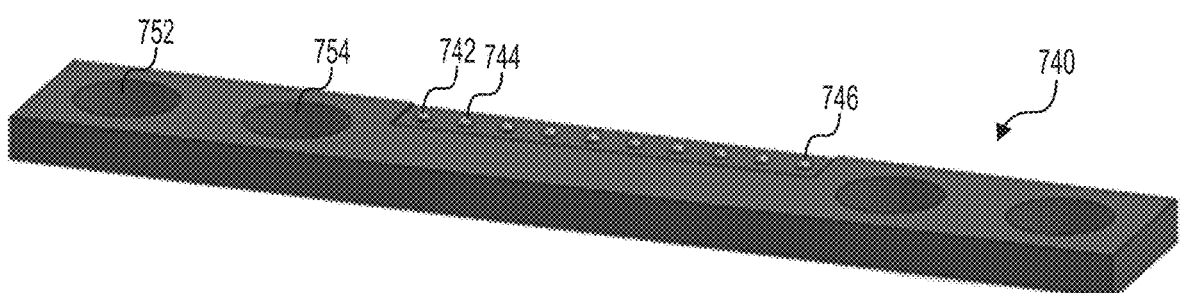
FIG. 7B shows a diagram of an example connector for use with the flexible cables for the HTS-based interconnect.
Figure 7C:
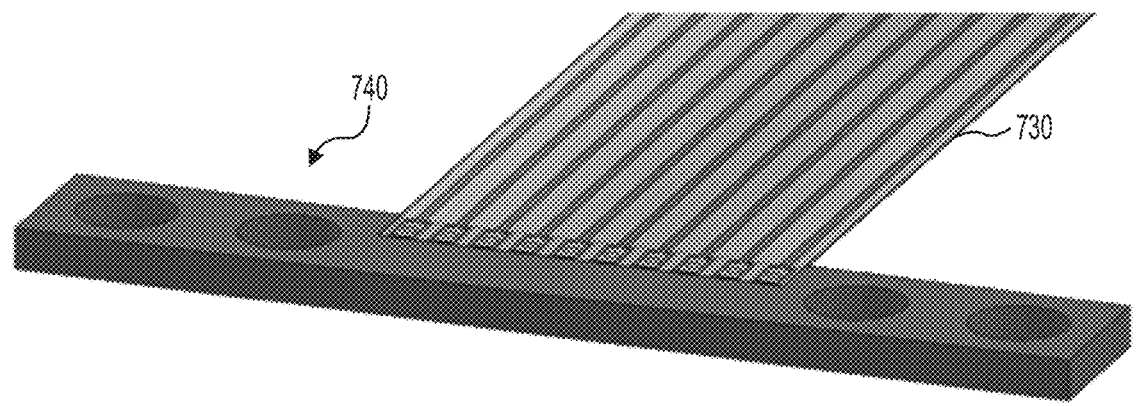
FIG. 7C shows a diagram of an interconnection between the example connector of FIG. 7B and a flexible cable.

FIG. 7B shows a diagram of an example connector block 740 for use with the flexible cables for the HTS-based interconnect. In this example, connector block 740 includes spring-loaded pins 742, 744, and 746. Spring-loaded pins 742, 744, and 746 (shown as part of connector block 740 in FIG. 7B) can be connected to flexible cable 730 as shown in FIG. 7C. In addition, connector block 740 can include other structures, such as holes 752 and 754. Although not shown, connector block 740 can include mechanical stops for proper alignment of the pads (e.g., widened pads 446, 456, and 466 shown in FIG. 4) on the flexible cable and the spring-loaded pins 742, 744, and 746. Regardless of whether pads or pins are used as part of the connector blocks, these pads/pins are connected outgoing/incoming electrical wiring formed using the strips described earlier. Connector blocks 710 and 740 can be formed as part of a printed circuit board (PCB), as well.

Figure 8:
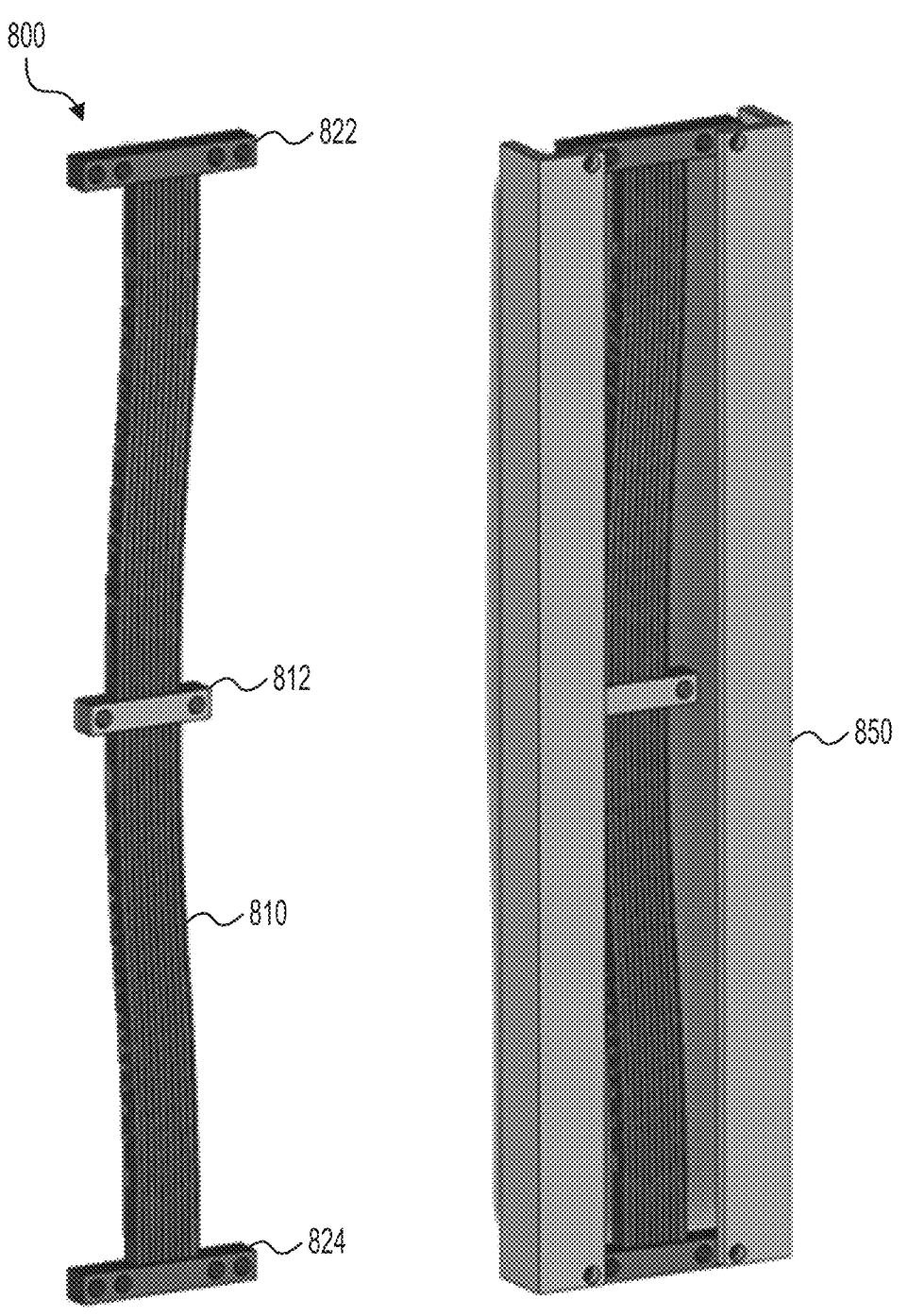
FIG. 8 shows a removable bracket for use with an HTS-based interconnect.

FIG. 8 shows a removable bracket 850 for use with an HTS-based interconnect 800. As described earlier, the HTS-based interconnect 800 may include flexible cables 810, spacer assembly 812, and connector blocks 822 and 824. To provide rigidity and protection during storage, handling, and installation of the HTS-based interconnect 800, it can be supported by removable bracket 850.

Figure 9:
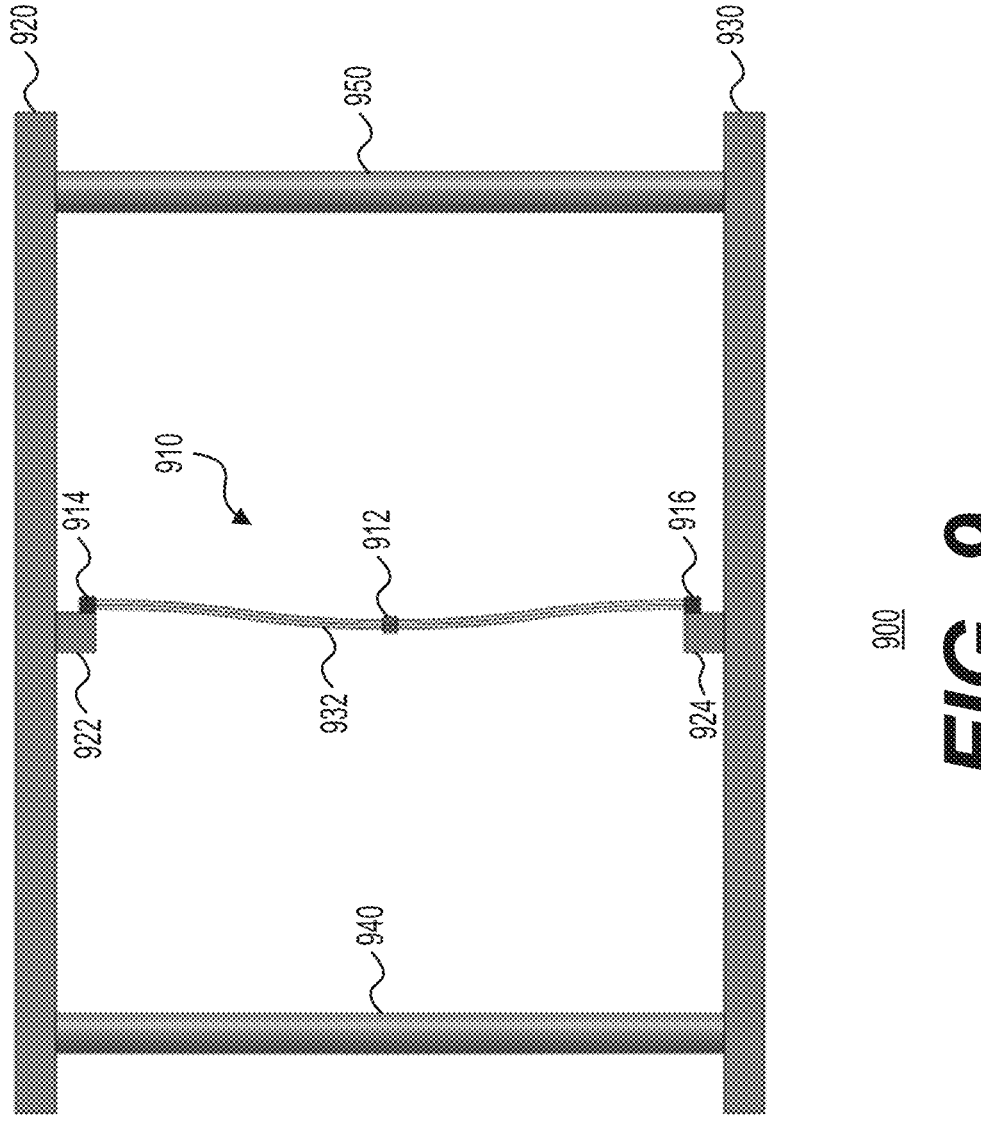
FIG. 9 shows an example (HTS)-based flexible cabling system including an HTS-based interconnect for interconnecting components in two different cryogenic temperature zones.

FIG. 9 shows an example HTS-based flexible cabling system 900 including an HTS-based interconnect 910 for interconnecting components in two different cryogenic temperature zones. HTS-based interconnect 910 includes multiple flexible cables that are spaced apart using a spacer assembly 912. Connector block 914 connects the strips formed as part of the flexible cables to a component 922 coupled to a cold plate 920. Cold plate 920 may be a 77 K cold plate. Another connector block 916 connects the strips formed as part of the flexible cables to a component 924 coupled to a cold plate 930. Cold plate 930 (coupled to a refrigeration system) may be a 4 K cold plate. Thermalization may be used to ensure that the temperature along the entire length of the multiple flexible cables is maintained below the critical superconducting temperature of the high-temperature superconductor included as part of the cables. Support rods 940 and 950 can be used to provide mechanical support for cold plates 920 and 930.

Advantageously, a bend (e.g., bend 932) allows for compliance despite the strain on the HTS-based flexible cables due to differences in thermal expansion (e.g., as a result of different coefficients of thermal expansion), alignment issues, or other mechanical forces. In addition, compared with conventional copper coaxial cables or stainless steel coaxial cables, HTS-based interconnects formed as a microstrip, a strip line, or a coplanar transmission line may permit the transmission of high-speed electrical signals over long distances with minimal loss. In addition, the physical cross section of such HTS-based interconnects may be small, so that large numbers of signals can be transmitted in a single flexible cable. The bundling of multiple flexible cables using components, such as spacer assemblies and connector blocks allows for modularization of the HTS-based interconnects for use with quantum computing systems. Advantageously, the use of HTS-based flexible cabling systems may also eliminate the need for converting electrical signals into optical signals or other signals having a frequency different from the differential signals being carried by the HTS-based flexible cables. In this way, high-speed continuous interconnection may be realized between components operating in two different cryogenic temperature zones without active electronics and minimal thermal loading of the components.

In conclusion, in one example, the present disclosure relates to a high temperature superconductor (HTS)-based flexible cabling system configured to interconnect a first set of components in a first cryogenic temperature zone with a second set of components in a second cryogenic temperature zone, where the first cryogenic temperature zone has a temperature between 2 kelvin to 10 kelvin and the second cryogenic temperature zone has a temperature between 30 kelvin to 92 kelvin. The HTS-based flexible cabling system may include a first HTS-based flexible cable arranged next to a second HTS-based flexible cable with at least one intervening spacer configured to maintain a fixed spacing between the first HTS-based flexible cable and the second HTS-based flexible cable.

Each of the first HTS-based flexible cable and the second HTS-based flexible cable may include traces to define individual strips having a first strip width in a first region along a length of each of the first HTS-based flexible cable and the second HTS-based flexible cable and a second strip width, different from the first strip width, in a second region where the at least one intervening spacer is overlapping with a respective HTS-based flexible cable. The HTS-based flexible cabling system may further include a heat-transfer structure coupled to the at least one intervening spacer and a temperature-dependent thermal conductor.

Each of the first HTS-based flexible cable and the second HTS-based flexible cable can include a bend for providing strain relief. Each of the first HTS-based flexible cable and the second HTS-based flexible cable may comprise a substrate formed from at least one of sapphire, yttria-stabilized zirconia (YSZ), or a polyimide. Moreover, each of the first HTS-based flexible cable and the second HTS-based flexible cable may comprise a high-temperature superconductor material selected from at least one of yttrium barium copper oxides (YBCOs), bismuth strontium calcium copper oxides (BSCCOs), or rare-earth metal oxides (REBCOs).

The HTS-based flexible cabling system may further include a connector block having connection points for coupling pads at a respective end of each of the first HTS-based flexible cable and the second HTS-based flexible cable to the first set of components, the second set of components, or another electrical structure. The heat-transfer structure may comprise a thermal clamp or a braid configured to couple the at least one intervening spacer to the temperature-dependent thermal conductor. In addition, the temperature-dependent thermal conductor comprises a heat pipe containing a fluid with a condensation temperature equal to, or above, 10 kelvin and below the superconducting transition temperature of the high-temperature superconductor material used to form each of the first HTS-based flexible cable and the second HTS-based flexible cable.

In another example, the present disclosure relates to a high temperature superconductor (HTS)-based flexible cabling system configured to interconnect a first set of components in a first cryogenic temperature zone with a second set of components in a second cryogenic temperature zone, where the first cryogenic temperature zone has a temperature between 2 kelvin to 10 kelvin and the second cryogenic temperature zone has a temperature between 30 kelvin to 92 kelvin. The HTS-based flexible cabling system may include a first HTS-based flexible cable arranged next to a second HTS-based flexible cable with at least one intervening spacer configured to maintain a fixed spacing between the first HTS-based flexible cable and the second HTS-based flexible cable.

Each of the first HTS-based flexible cable and the second HTS-based flexible cable includes traces to define individual strips having a first strip width in a first region along a length of each of the first HTS-based flexible cable and the second HTS-based flexible cable and a second strip width, different from the first strip width, in a second region where the at least one intervening spacer is overlapping with a respective HTS-based flexible cable, and where each of the first HTS-based flexible cable and the second HTS-based flexible cable includes widened pads at respective ends. The HTS-based flexible cabling system may further include a heat-transfer structure coupled to the at least one intervening spacer and a temperature-dependent thermal conductor.

Each of the first HTS-based flexible cable and the second HTS-based flexible cable may include a bend for providing strain relief. Each of the first HTS-based flexible cable and the second HTS-based flexible cable may comprise a substrate formed from at least one of sapphire, yttria-stabilized zirconia (YSZ), or a polyimide. Moreover, each of the first HTS-based flexible cable and the second HTS-based flexible cable may comprise a high-temperature superconductor material selected from at least one of yttrium barium copper oxides (YBCOs), bismuth strontium calcium copper oxides (BSCCOs), or rare-earth metal oxides (REBCOs).

The HTS-based flexible cabling system may further include a connector block having connection points for coupling the widened pads to the first set of components, the second set of components, or another electrical structure. The heat-transfer structure may comprise a thermal clamp or a braid configured to couple the at least one intervening spacer to the temperature-dependent thermal conductor. In addition, the temperature-dependent thermal conductor may comprise a heat pipe containing a fluid with a condensation temperature equal to, or above, 10 kelvin and below the superconducting transition temperature of the high-temperature superconductor material used to form each of the first HTS-based flexible cable and the second HTS-based flexible cable.

In yet another example, the present disclosure relates to a high temperature superconductor (HTS)-based flexible cabling system configured to interconnect a first set of components in a first cryogenic temperature zone with a second set of components in a second cryogenic temperature zone, where the first cryogenic temperature zone has a temperature between 2 kelvin to 10 kelvin and the second cryogenic temperature zone has a temperature between 30 kelvin to 92 kelvin. The HTS-based flexible cabling system may include a first HTS-based flexible cable arranged next to a second HTS-based flexible cable with at least one intervening spacer configured to maintain a fixed spacing between the first HTS-based flexible cable and the second HTS-based flexible cable. Each of the first HTS-based flexible cable and the second HTS-based flexible cable includes traces to define individual strips having a first strip width in a first region along a length of each of the first HTS-based flexible cable and the second HTS-based flexible cable and a second strip width, different from the first strip width, in a second region where the at least one intervening spacer is overlapping with a respective HTS-based flexible cable, and where each of the first HTS-based flexible cable and the second HTS-based flexible cable includes a widened pads at each respective ends.

The HTS-based flexible cabling system may further include a connector block having connection points for coupling the widened pads at each of the respective ends to the first set of components, the second set of components, or another electrical structure. The HTS-based flexible cabling system may further include a heat-transfer structure coupled to the at least one intervening spacer and a temperature-dependent thermal conductor.

Each of the first HTS-based flexible cable and the second HTS-based flexible cable may comprises a substrate formed from at least one of sapphire, yttria-stabilized zirconia (YSZ), or a polyimide. Moreover, the connection points may comprise pads or spring-loaded pins.

Each of the first HTS-based flexible cable and the second HTS-based flexible cable may include a bend for providing strain relief. The heat-transfer structure may comprise a thermal clamp or a braid configured to couple the at least one intervening spacer to the temperature-dependent thermal conductor. In addition, the temperature-dependent thermal conductor may comprise a heat pipe containing a fluid with a condensation temperature equal to, or above, 10 kelvin and below a superconducting transition temperature of the high-temperature superconductor material used to form each of the first HTS-based flexible cable and the second HTS-based flexible cable.

It is to be understood that the methods, modules, and components depicted herein are merely exemplary. Alternatively, or in addition, the functionality described herein can be performed, at least in part, by one or more hardware logic components. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality. Merely because a component, which may be an apparatus, a structure, a system, or any other implementation of a functionality, is described herein as being coupled to another component does not mean that the components are necessarily separate components. As an example, a component A described as being coupled to another component B may be a sub-component of the component B, or the component B may be a sub-component of the component A.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A high temperature superconductor (HTS)-based flexible cabling system configured to interconnect a first set of components in a first cryogenic temperature zone with a second set of components in a second cryogenic temperature zone, wherein the first cryogenic temperature zone has a temperature between 2 kelvin to 10 kelvin and the second cryogenic temperature zone has a temperature between 30 kelvin to 92 kelvin, the system comprising:

a first HTS-based flexible cable arranged next to a second HTS-based flexible cable with at least one intervening spacer configured to maintain a fixed spacing between the first HTS-based flexible cable and the second HTS-based flexible cable, wherein each of the first HTS-based flexible cable and the second HTS-based flexible cable includes traces to define individual strips having a first strip width in a first region along a length of each of the first HTS-based flexible cable and the second HTS-based flexible cable and a second strip width, different from the first strip width, in a second region where the at least one intervening spacer is overlapping with a respective HTS-based flexible cable; and a heat-transfer structure coupled to the at least one intervening spacer and a temperature-dependent thermal conductor.

2. The HTS-based flexible cabling system of claim 1, wherein each of the first HTS-based flexible cable and the second HTS-based flexible cable includes a bend for providing strain relief.

3. The HTS-based flexible cabling system of claim 2, wherein each of the first HTS-based flexible cable and the second HTS-based flexible cable comprises a substrate formed from at least one of sapphire, yttria-stabilized zirconia (YSZ), or a polyimide.

4. The HTS-based flexible cabling system of claim 3, wherein each of the first HTS-based flexible cable and the second HTS-based flexible cable comprises a high-temperature superconductor material selected from at least one of yttrium barium copper oxides (YBCOs), bismuth strontium calcium copper oxides (BSCCOs), or rare-earth metal oxides (REBCOs).

5. The HTS-based flexible cabling system of claim 1, further comprising a connector block having connection points for coupling pads at a respective end of each of the first HTS-based flexible cable and the second HTS-based flexible cable to the first set of components, the second set of components, or another electrical structure.

6. The HTS-based flexible cabling system of claim 1, wherein the heat-transfer structure comprises a thermal clamp or a braid configured to couple the at least one intervening spacer to the temperature-dependent thermal conductor.

7. The HTS-based flexible cabling system of claim 6, wherein the temperature-dependent thermal conductor comprises a heat pipe containing a fluid with a condensation temperature equal to, or above, 10 kelvin and below a superconducting transition temperature of the high-temperature superconductor material used to form each of the first HTS-based flexible cable and the second HTS-based flexible cable.

8. A high temperature superconductor (HTS)-based flexible cabling system configured to interconnect a first set of components in a first cryogenic temperature zone with a second set of components in a second cryogenic temperature zone, wherein the first cryogenic temperature zone has a temperature between 2 kelvin to 10 kelvin and the second cryogenic temperature zone has a temperature between 30 kelvin to 92 kelvin, the system comprising:

a first HTS-based flexible cable arranged next to a second HTS-based flexible cable with at least one intervening spacer configured to maintain a fixed spacing between the first HTS-based flexible cable and the second HTS-based flexible cable, wherein each of the first HTS-based flexible cable and the second HTS-based flexible cable includes traces to define individual strips having a first strip width in a first region along a length of each of the first HTS-based flexible cable and the second HTS-based flexible cable and a second strip width, different from the first strip width, in a second region where the at least one intervening spacer is overlapping with a respective HTS-based flexible cable, and wherein each of the first HTS-based flexible cable and the second HTS-based flexible cable includes widened pads at respective ends; and a heat-transfer structure coupled to the at least one intervening spacer and a temperature-dependent thermal conductor.

9. The HTS-based flexible cabling system of claim 8, wherein each of the first HTS-based flexible cable and the second HTS-based flexible cable includes a bend for providing strain relief.

10. The HTS-based flexible cabling system of claim 9, wherein each of the first HTS-based flexible cable and the second HTS-based flexible cable comprises a substrate formed from at least one of sapphire, yttria-stabilized zirconia (YSZ), or a polyimide.

11. The HTS-based flexible cabling system of claim 10, wherein each of the first HTS-based flexible cable and the second HTS-based flexible cable comprises a high-temperature superconductor material selected from at least one of yttrium barium copper oxides (YBCOs), bismuth strontium calcium copper oxides (BSCCOs), or rare-earth metal oxides (REBCOs).

12. The HTS-based flexible cabling system of claim 8, further comprising a connector block having connection points for coupling the widened pads to the first set of components, the second set of components, or another electrical structure.

13. The HTS-based flexible cabling system of claim 8, wherein the heat-transfer structure comprises a thermal clamp or a braid configured to couple the at least one intervening spacer to the temperature-dependent thermal conductor.

14. The HTS-based flexible cabling system of claim 13, wherein the temperature-dependent thermal conductor comprises a heat pipe containing a fluid with a condensation temperature within equal to, or above, 10 kelvin and below a superconducting transition temperature of the high-temperature superconductor material used to form each of the first HTS-based flexible cable and the second HTS-based flexible cable.

15. A high temperature superconductor (HTS)-based flexible cabling system configured to interconnect a first set of components in a first cryogenic temperature zone with a second set of components in a second cryogenic temperature zone, wherein the first cryogenic temperature zone has a temperature between 2 kelvin to 10 kelvin and the second cryogenic temperature zone has a temperature between 30 kelvin to 92 kelvin, the system comprising:

a first HTS-based flexible cable arranged next to a second HTS-based flexible cable with at least one intervening spacer configured to maintain a fixed spacing between the first HTS-based flexible cable and the second HTS-based flexible cable, wherein each of the first HTS-based flexible cable and the second HTS-based flexible cable includes traces to define individual strips having a first strip width in a first region along a length of each of the first HTS-based flexible cable and the second HTS-based flexible cable and a second strip width, different from the first strip width, in a second region where the at least one intervening spacer is overlapping with a respective HTS-based flexible cable, and wherein each of the first HTS-based flexible cable and the second HTS-based flexible cable includes a widened pads at each respective ends;

a connector block having connection points for coupling the widened pads at each of the respective ends to the first set of components, the second set of components, or another electrical structure; and a heat-transfer structure coupled to the at least one intervening spacer and a temperature-dependent thermal conductor.

16. The HTS-based flexible cabling system of claim 15, wherein each of the first HTS-based flexible cable and the second HTS-based flexible cable comprises a substrate formed from at least one of sapphire, yttria-stabilized zirconia (YSZ), or a polyimide.

17. The HTS-based flexible cabling system of claim 15, wherein the connection points comprise pads or spring-loaded pins.

18. The HTS-based flexible cabling system of claim 15, wherein each of the first HTS-based flexible cable and the second HTS-based flexible cable includes a bend for providing strain relief.

19. The HTS-based flexible cabling system of claim 15, wherein the heat-transfer structure comprises a thermal clamp or a braid configured to couple the at least one intervening spacer to the temperature-dependent thermal conductor.

20. The HTS-based flexible cabling system of claim 19, wherein the temperature-dependent thermal conductor comprises a heat pipe containing a fluid with a condensation temperature equal to, or above, 10 kelvin and below a superconducting transition temperature of the high-temperature superconductor material used to form each of the first HTS-based flexible cable and the second HTS-based flexible cable.

\*    \*    \*    \*    \*